(12) United States Patent
Hayashi et al.

(10) Patent No.: US 7,282,763 B2
(45) Date of Patent: Oct. 16, 2007

(54) FIELD EFFECT TRANSISTOR FORMED ON AN INSULATING SUBSTRATE AND INTEGRATED CIRCUIT THEREOF

(75) Inventors: Yutaka Hayashi, 3-10, Umezono 2-chome, Tsukuba-shi, Ibaraki (JP); Hisashi Hasegawa, Chiba (JP); Hiroaki Takasu, Chiba (JP); Jun Osanai, Chiba (JP)

(73) Assignees: Seiko Instruments Inc. (JP); Yutaka Hayashi (JP)

( * ) Notice: Subject to any disclaimer, the term of this patent is extended or adjusted under 35 U.S.C. 154(b) by 0 days.

(21) Appl. No.: 10/228,847

(22) Filed: Aug. 27, 2002

(65) Prior Publication Data

US 2003/0052373 A1 Mar. 20, 2003

(30) Foreign Application Priority Data

Aug. 28, 2001 (JP) ............................. 2001-258334
Sep. 12, 2001 (JP) ............................. 2001-276805

(51) Int. Cl.
*H01L 29/94* (2006.01)

(52) U.S. Cl. ..................................... 257/335
(58) Field of Classification Search .................... None
See application file for complete search history.

(56) References Cited

U.S. PATENT DOCUMENTS 4,375,717 A * 3/1983 Tonnel ....................... 438/268
5,528,063 A * 6/1996 Blanchard .................. 257/335
6,441,434 B1 * 8/2002 Long et al. ................. 257/347
2001/0045600 A1 * 11/2001 Furuhata .................... 257/335

* cited by examiner

*Primary Examiner*—Kiesha Rose
(74) *Attorney, Agent, or Firm*—Adams & Wilks

(57) ABSTRACT

A field effect transistor has an insulating substrate, a semiconductor thin film formed on the insulating substrate, and a gate insulating film formed on the semiconductor thin film. A first gate electrode is formed on the gate insulating film. A first region and a second region having a first conductivity type are formed on or in a surface of the semiconductor thin film on opposite sides of the first gate electrode in a length direction thereof. A third region having a second conductivity type opposite the first conductivity type is arranged on or in the semiconductor film side by side with the second region in a width direction of the first gate electrode. A conductive thin film is connected with the second region and the third region. A second gate electrode is formed on the gate insulating film along the second region. A fourth region having the first conductivity type is formed on or in the semiconductor film on an opposite side of the second region with respect to the second gate electrode. One of the first and the fourth regions is used as an output region according to a circuit operation and without application of a fixed bias potential to the third region.

10 Claims, 12 Drawing Sheets

<u>PRIOR ART</u>

FIELD EFFECT TRANSISTOR FORMED ON AN INSULATING SUBSTRATE AND INTEGRATED CIRCUIT THEREOF

BACKGROUND OF THE INVENTION

1. Field of the Invention

The present invention relates to a field effect transistor formed on a semiconductor thin film formed on an insulating substrate represented by SOI (silicon on insulator), polycrystalline silicon on a glass substrate, and SOS (silicon on sapphire), and to an integrated circuit thereof.

2. Description of the Related Art

Conventionally, in a MOS field effect transistor (hereinafter, abbreviated as a MOS transistor) formed on the SOI etc., if a silicon thin film portion referred to as a body where a channel is formed is in a floating state, at the time of increasing a drain voltage, a strong electric field generated between a drain and the body causes a current to flow therebetween, so that the current flows into a source from the body. Due to this inflow of current, the body and the source are subjected to a forward bias and a gate threshold voltage Vth of the MOS transistor is lowered. Further, this current is amplified through a parasitic bipolar transistor where the source is used as an emitter and the body is used as a base, and a current is further attained from the drain operating as a collector in the parasitic bipolar transistor. Through a positive feedback phenomenon like this, a drain current is abruptly increased at a certain drain voltage or higher, so that the MOS transistor using the body in a floating state is decreased in withstand voltage. In addition, even in a range of the drain voltage lower than that causing an abrupt increase in the current, there is caused an increase in an output conductance which adversely affects a voltage amplification factor of an analog circuit. A typical output current increase phenomenon is called a kink effect which is exhibited by the drain current being increased stepwise at 3 to 4 V in the voltage applied between the drain and the source.

For the purpose of improving the phenomenon, in order to fix the body at a constant potential, conventionally used are a T-type transistor structure as shown in a plan view of FIG. 1, an Htype transistor structure as shown in a plan view of FIG. 2, a source tie structure as shown in a plan view of FIG. 3, and an underlying or embedded body contact structure as shown in a sectional view of FIG. 4.

In the figures, reference numeral 111 denotes a drain region having a first conductivity type; 121, a source region having the first conductivity type; 131, a body contact region having a reverse conductivity type; and 400, a conductive gate region. Reference numerals 113, 123, 133, and 403 denote contact holes formed on the drain region, the source region, the body contact region, and the gate region, respectively. Through the contact holes, the respective regions are connected to metal thin film wirings 501, 502, 503, and 504, respectively. As shown in FIG. 4, below the gate region 400 between the drain region 111 and the source region 121, a gate insulating film 200 and a portion 100 corresponding to the body where the channel is formed are formed. In FIG. 4, reference numeral 10 denotes a supporting substrate; 102, an embedded or underlying body portion; 20, an insulating layer for allowing an insulating between the supporting substrate and a semiconductor thin film (consisting of the drain region 111, the source region 121, the body contact region 131, the portion 100, and the underlying body portion 102); 300, so-called field insulating films for isolating elements from each other; and 310, insulating layers for insulating the wiling and the semiconductor thin film from each other.

As shown in the T-type structure of FIG. 1 and the H-type structure of FIG. 2, the body portion is connected to the body contact region 131 through a portion below the gate region between the body contact region 131 and the source and drain regions. In these structures, the body contact region is arranged symmetrical to the source and the drain regions, which enables a so-called bi-directional circuit operation where functions of the source and the drain interchange each other. On the contrary, in the source tie structure of FIG. 3 and the underlying body contact structure of FIG. 4, the source region and the body contact region are connected, which does not allow exchanging the function between the source and drain and allows only a so-called single-polarity or one-directional circuit operation.

In both the T-type and H-type structures as described above, the electrical potential of the body is fixed through a body contact electrode 503 and 5031, respectively, to realize a usable drain to source voltage (more than a few volts) by preventing a so-called floating body effect. However, the body contact region is formed at an end portion in a gate width direction through the body below the gate. Also, in the source tie structure, the body contact region 131 is formed at both ends of the source in the gate width direction.

Therefore, if a gate width W of the transistor is increased, in the T-type transistor the resistance between the body contact region 131 and the farthest portion of the body from the contact regions on the opposite side thereof becomes high, with the result that an effect due to the fixed body potential is weakened. Also in the H-type transistor and the source tie transistor, if the gate width W is increased, at a central portion of the body under the gate, the effect due to the fixed body potential is weakened.

The underlying body contact structure is a structure in which a contact portion 130 and the body 100 below the gate are continuously arranged through a portion below a source 120, 60 that if a source junction part reaches a deep portion of the film, the underlying body portion 102 between the body contact region and the body below the gate is increased in resistance, with the result that the effect due to the fixed body potential is weakened. In the future, since a technology for making the semiconductor thin film is advancing toward making the % wemiconductor thin film which is further thin, it is unavoidable that the resistance in the underlying body portion is increased.

Also in the above-mentioned T-type and H-type transistors, there has been a problem in terms of a circuit application. That is, the advantage that the bi-directional circuit operation is possible is applicable only in a range of a so-called reverse polarity with respect to the body contact potential. Therefore, once the potential of, for example, a p-type body is fixed, it is impossible for the source and the drain to operate securely at a negative potential with respect to the above potential (to be strict, at a negative potential exceeding the forward voltage of a pn junction). Thus the conventional T-type and H-type transistors also suffered from single polarity circuit operation.

SUMMARY OF THE INVENTION

The present invention has been made in view of the above-mentioned circumstances in a technical field, and therefore an object of the present invention is to provide a structure in which even if a gate width is increased, it is possible to prevent a decrease in a withstand voltage of a drain or an increase in an output conductance. Further, in a source tie structure a circuit application with the source and the drain being interchanged is impossible. Another object of the present invention is to provide a structure for solving this problem as well.

Also in the T-type and the H-type transistors as described above in a circuit application, after a body contact potential is set, a potential at which the drain and the source operate securely is limited to a single polarity potential, which is a positive or negative potential, with respect to the body contact potential. Still another object of the present invention is to eliminate this limitation on the polarity of the potential.

According to the present invention, a field effect transistor is formed on a semiconductor thin film formed on an insulating substrate by the following means.

According to a first means of the present invention, there is provided a field effect transistor formed on an insulating substrate, including at least:

an insulating substrate;

a semiconductor thin film formed on the insulating substrate;

a grate insulating film on the semiconductor thin film;

a first gate electrode with a length and a width, which is formed on the gate insulating;

a first region and a second region having a first conductivity type which are disposed on or in the surface of the semiconductor thin film and arranged at both sides of the first gate electrode in a length direction thereof as viewed in a plan view;

a third region having a reverse conductivity type, which is disposed side by side with the second region in a gate width direction perpendicular to the first region and to the second region direction;

a conductive thin film connecting the second region with the third region;

a second gate electrode with a length and a width, which is formed on the surface of the semiconductor thin film along the second regions via the gate insulating film; and a fourth region having the first conductivity type, which is disposed in or on the surface of the semiconductor thin film, the fourth region and the second region being disposed on both sides of the second gate electrode in a length direction, and the first and the fourth regions being set as an output region.

The first means becomes a solution for realizing a bi-directional operation with both polarity and high drain withstand voltage and low output conductance.

According to a second means of the present invention, further in the field effect transistor formed on an insulating substrate, the second region comprises a plurality of regions sandwiching the third region.

According to a third means of the present invention, further in the field effect transistor formed on an insulating substrate, the third region comprises a plurality of regions sandwiching the second region.

The second and third means are solutions for realizing high drain withstand voltage and low output conductance even with wide gate width devices.

According to a fourth means of the present invention, further in the field effect transistor formed on an insulating substrate, the first and the fourth regions are formed so as to have a portion with a relatively high impurity concentration (for example, impurity concentration of $10^{20}$ atoms/cc or more) and a portion with a relatively low impurity concentration (for example, impurity concentration of about $10^{20}$ to $10^{18}$ atoms/cc), the portion with a relatively low impurity concentration being arranged close to the gate electrode, i.e., being partially overlapped with the gate electrode via an insulating film.

The fourth means is another solution for realizing high drain withstand voltage and low output conductance.

Note that, in the present invention, the term insulating substrate refers to a substrate obtained by forming an insulating film such as a silicon oxide film or a silicon nitride film on the surface of the semiconductor substrate such as silicon, or an insulator substrate made of quartz glass, alumina, etc., or an insulating crystalline substrate made of sapphire etc. As for the formation of the semiconductor thin film, there are used a method of reducing a film thickness by performing polishing after bonding the semiconductor substrate to the insulating substrate, a method of peeling off a portion to be a thin film after bonding a semiconductor substrate on which the peeled-off portion was formed to the insulating substrate, a method of allowing a hetero-epitaxial growth on the crystalline substrate made of sapphire etc., a method called SIMOX in which oxygen ions are implanted into the silicon substrate surface by ion implantation and heat treatment is then performed to form an oxide film and further a silicon thin film thereon, a method of forming a film on the insulating substrate by using a CVD, and the like.

In both cases of a partial depletion type of the field effect transistor and a full depletion type thereof, and even in a case where a semiconductor similar to "an intrinsic semiconductor: is used for the semiconductor thin film, the reverse conductivity type carriers generated due to a high electric field between the drain and the body are collected in the third regions having a reverse conductivity type, so that the object of the present invention is achieved.

According to the first means of the present invention, in a circuit operation, the potential of the body contact is automatically changed to an optimum potential following a change in a polarity of the output voltage without any external supply to the body contact. Therefore, the conventional limitation on the output potential caused by the body contact potential is eliminated, and it is possible to realize a bi-directional operation in which the source and the drain are interchancreable and capable of a positive potential output and a negative potential output with respect to the conventional body contact potential.

In the conventional H-type and T-type transistors capable of a bi-directional operation, a length in the W direction cannot be designed to be large because of a limitation determined by a withstand voltage of the drain and by the output conductance. According to the present invention, the length in the W direction can be made large as possible within a range allowable from a viewpoint of a chip area. Thus, in the transistor, on-resistance and transconductance can be each set to a value necessary for a circuit operation.

On the other hand, assuming that a plurality of conventional type transistors are arranged and interconnected in order to constitute a transistor with large value of W, the H-type transistors are arranged, resulting in a complicated interconnection. Further, in order to obtain a transistor high in a withstand voltage or an output resistance, a value of W is not made large in one unit, with the result that an area required for interconnecting the above unit transistors becomes of the order of the total area of unit transistor. Therefore, the transistor according to the structure of the present invention is advantageous in terms of a simple layout in which a complicated interconnection is eliminated.

Further, according to the structure of the present invention, one region serving as the source from one of the first region and the fourth region is forward biased with respect to the body. However, the minority carriers injected in the body from the source are absorbed in the second region in a floating state and thus the minority carriers hardly affect the body between the second region and the region serving as the drain.

The transistor of the present invention operates in such a manner that the channel (length: L1) below the first gate electrode and the channel (length: L2) below the second gate electrode are connected in series. Thus, it might be considered that the on-resistance per unit channel width (W) equals to (L1+L2)/L1 times and the output current becomes L1/(L1+L2). However, these reductions are improved in the following way.

As described above, when the source and the body are forward-biased, the threshold voltage Vth of the channel on the source side is lower than that on the drain side. Therefore, resistance in the channels connected in series to the source side is lower than that on the drain side. In particular, when a gate bias voltage approximates the threshold voltage Vth of the channel on the drain side, due to this phenomenon, the decrease of the drain current is improved. Also, in a case where a partial depletion type SOI is used and in addition, the output voltage is high, a voltage drop in the channel on the source side is clamped on the forward voltage of a diode between the source and the body, so that the output current value is improved also in this case.

DETAILED DESCRIPTION OF THE PREFERRED EMBODIMENT

Figure 5:
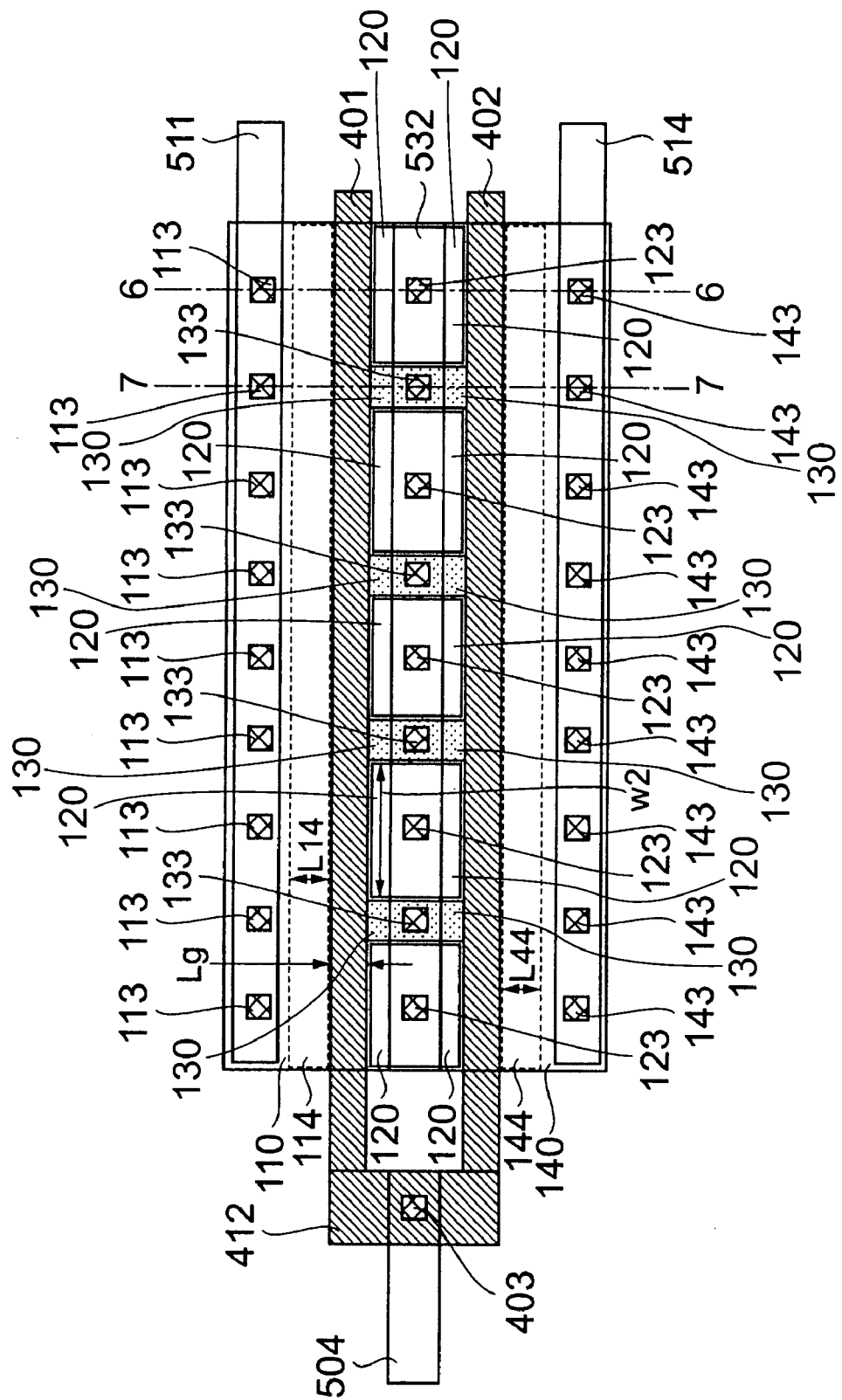
FIG. 5 is a plan view showing a bipolar transistor in accordance with an embodiment of the present invention.
Figure 6:
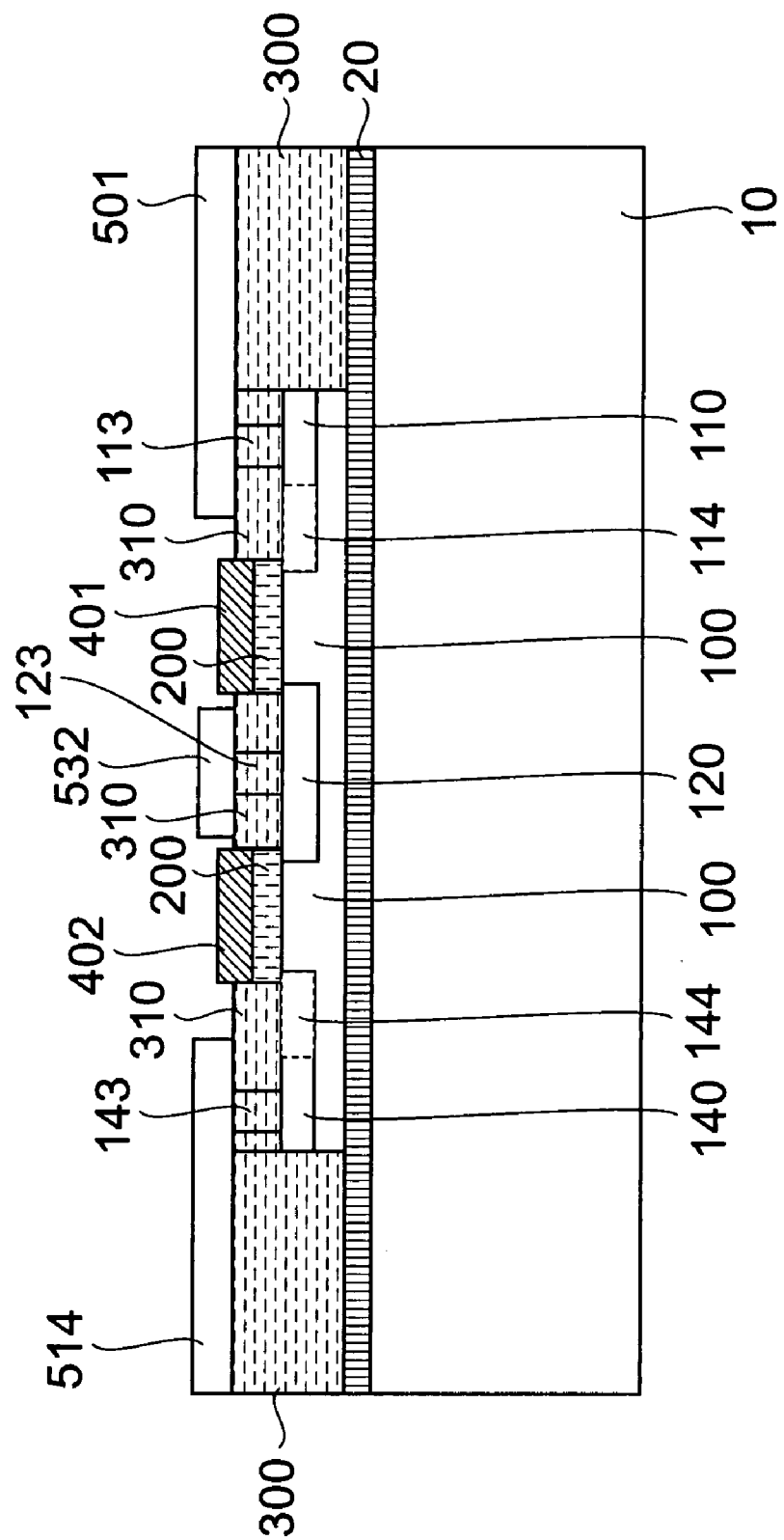
FIG. 6 is a sectional view taken along the line 6-6 of FIG. 5 in accordance with the present invention.
Figure 7:
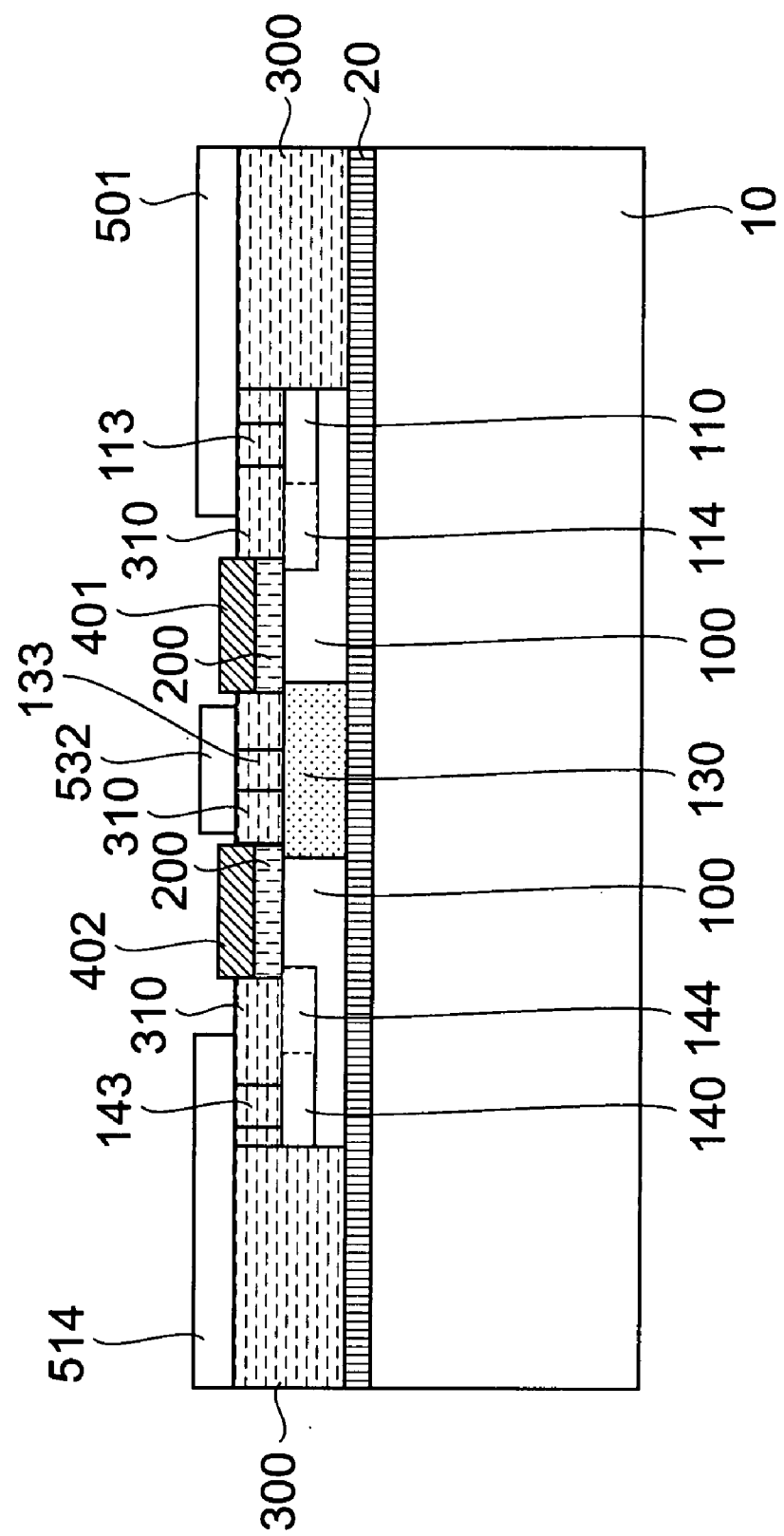
FIG. 7 is a sectional view taken along the line 7-7 of FIG. 5 in accordance with the present invention.

Hereinafter, an embodiment of the present invention will be described. FIG. 5 shows a plan structural example of the present invention. FIGS. 6 and 7 show sectional structural examples thereof. In FIG. 5, reference numeral 110 denotes a first region having a first conductivity type; 120, second regions having the first conductivity type; 130, third regions having a reverse conductivity type; and 140, a fourth region having a reverse conductivity type. Reference numerals 401 and 402 denote first and second conductive gate electrodes. Denoted by 412 is a conductive thin film for connecting the first and second conductive gate electrodes, which is made of the same material as that for the conductive gate electrodes in this embodiment (for example, polycrystalline silicon, or a two-layer film consisting of tungsten silicide and the polycrystalline silicon or a two-layer film consisting of titanium silicide or cobalt silicide and the polycrystalline silicon), the film and the electrodes being arranged continuously. Reference numerals 114 and 144 denote portions with a low impurity concentration formed in the first and fourth regions an partially overlapped with the first and second conductive gate electrode 401 and 402 via gate insulating films, respectively. Here, if it is not required for the first and fourth regions serving as output regions to withstand a high voltage, the portions 114 and 144 may be eliminated. Reference numerals 113, 123, 133, 143, and 403 respectively denote contact holes for the first, the second, the third, and the fourth regions, and the gate electrode, through which the respective regions and metal thin film wirings 511, 532, 514, and 504 are connected. The metal thin film wiring 532 connects the second and the third regions through the contact holes 123 and 133, but a potential is not fixed.

FIG. 6 is a sectional view taken along the line 6-6 of FIG. 5 in accordance with the embodiment of the present invention. FIG. 7 is a sectional view taken along the line 7-7 of FIG. 5. In the figures, reference numeral 10 denotes a supporting substrate; 100, bodies; 200, gate insulating films; 20, insulating layers for allowing an insulation between the supporting substrate and a semiconductor thin film (consisting of the first region 110, (the portion 114), the second region 120, the third region 130 (not shown in FIG. 6), the fourth region 140, (the portion 144), and the bodies 100); 300, so-called field insulation films for isolating elements from each other; and 310, insulating layers for insulating the wirings and the semiconductor thin film from each other. The channel is induced in the surface or in an inner portion of the body between the first and the second regions and in the surface or in an inner portion of the body between the second and the fourth regions. Via the gate insulating films on the bodies, a potential of the first and second gate electrodes is used for controlling the electric resistance of the channels. As shown in FIG. 7, the bodies 100 are formed adjacent to a body contact region 130. The body contact region may be formed by using a semiconductor region in which an impurity (e.g., boron) having a reverse conductivity type is added at 1E19 atoms/cc or more and low resistance is attained. However, in the case where the body contact region performs a function of absorbing carriers having a reverse conductivity type or a function of controlling Fermi level thereof, the present invention can be implemented, so that the body contact region may be formed as a metal or silicide thin film partially contacting the body. In this case, it can be formed as a common region to the wiring 532 for the second region. Also, a different kind of semiconductor region which allows hetero-junction with the body may be used.

The body may be of the reverse conductivity type, an intrinsic type, or the first conductivity type. In the case of the first conductivity type, it is preferable that, in order to obtain an enhancement type transistor, carrier depletion is achieved from the front side of the body to the rear side thereof at 0V in a gate voltage.

A dimension of the third region in a gate width direction may be set to a minimum value available in a lithography technique. It is unnecessary to provide separately the contact holes for the second region and for the third region. The contact hole may be formed in a portion including the boundary between the second and the third regions in common.

Figure 1:
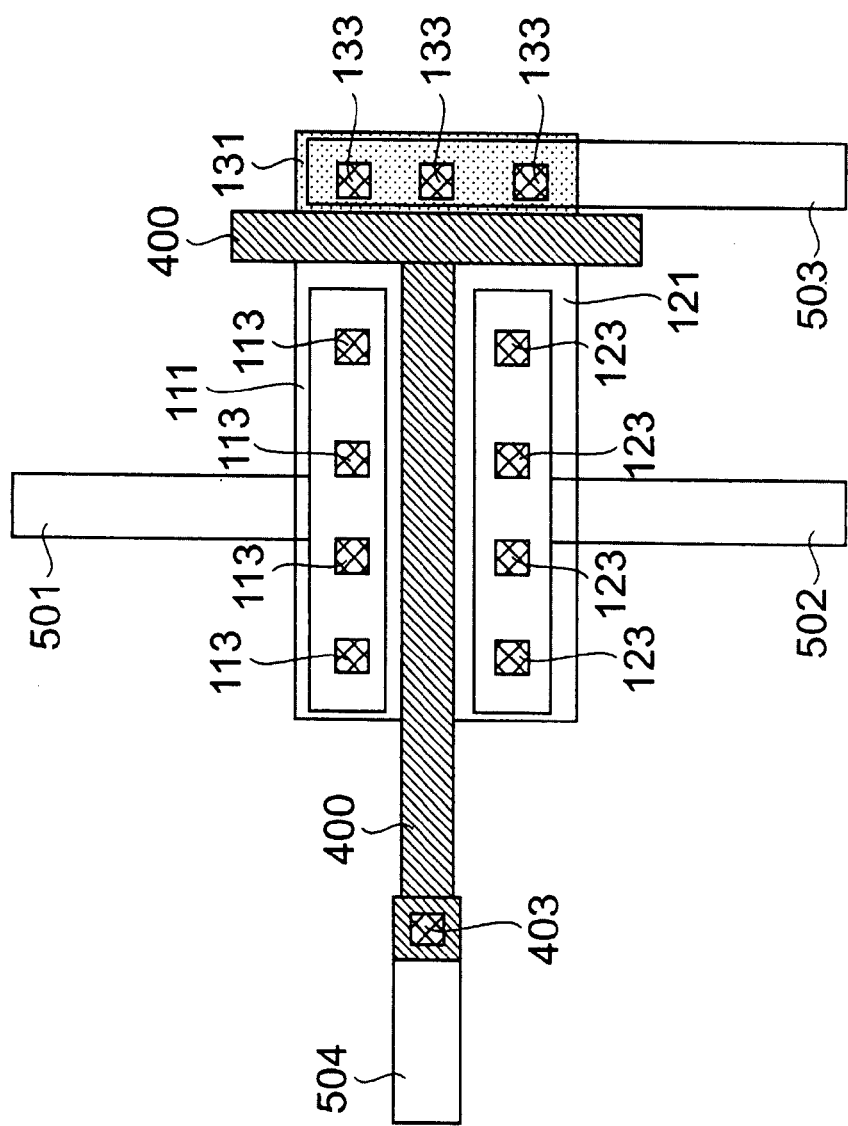
FIG. 1 is a plan view showing an example of a conventional T-type bi-directional transistor of single polarity operation.
Figure 2:
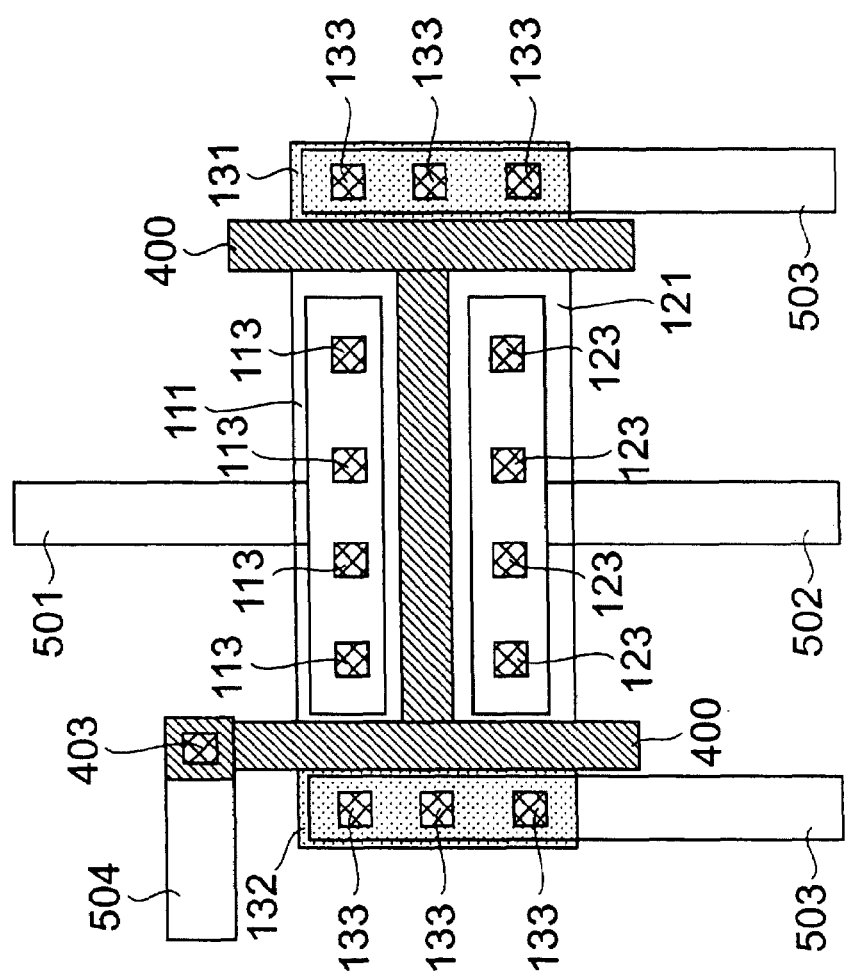
FIG. 2 is a plan view showing an example of a conventional H-type bi-directional transistor of single polarity operation.
Figure 3:
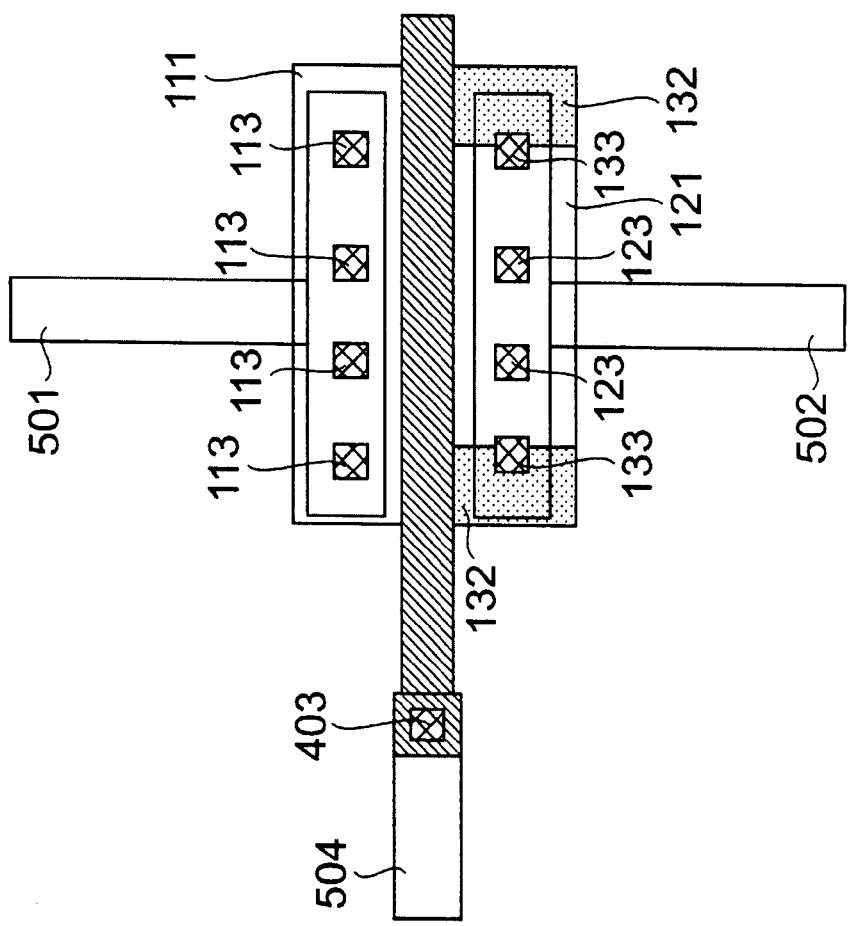
FIG. 3 is a plan view showing an example of a conventional source tie type one-direction transistor.
Figure 4:
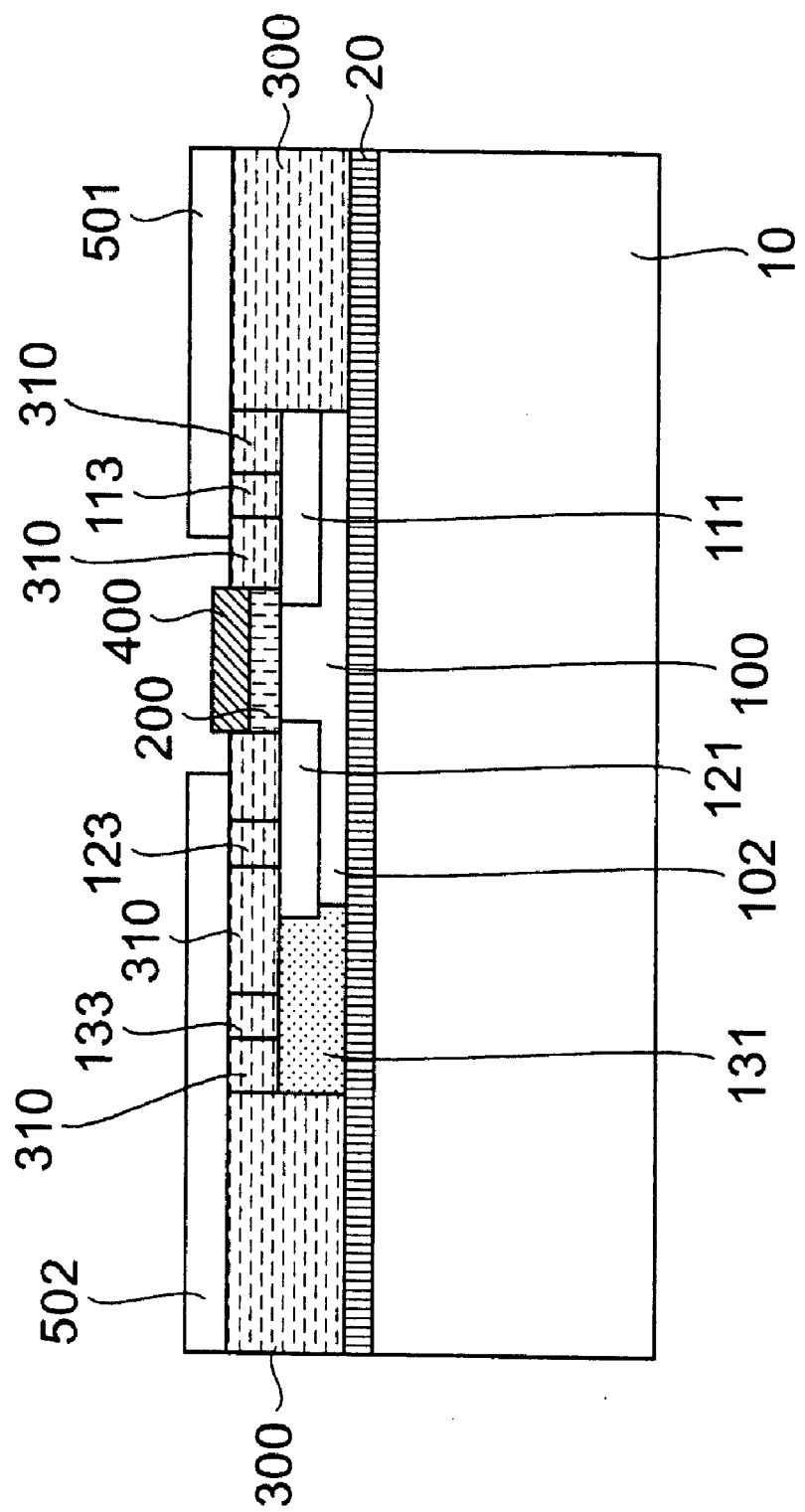
FIG. 4 is a sectional view showing an example of a conventional underlying body contact structure.

Electric characteristics of the transistor in accordance with the embodiment of the present invention are compared with those of the transistor of the source tie structure shown in FIG. 3. Structures and material parameters used for measurement are as follows.

Figure 8A:
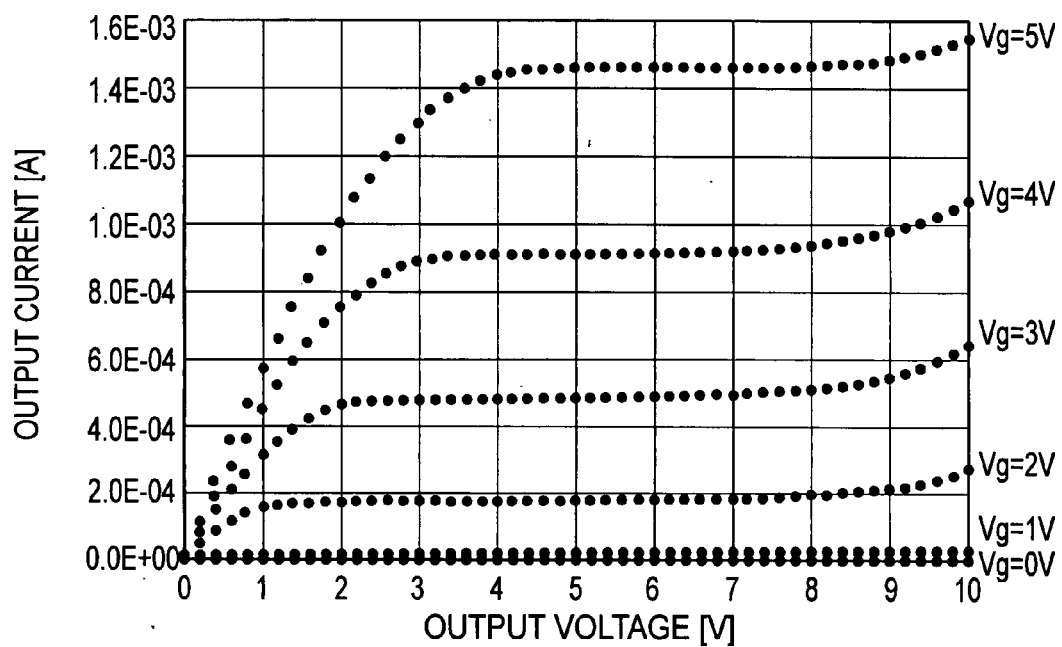
FIG. 8A shows output characteristics of the source tied type transistor.
Figure 8B:
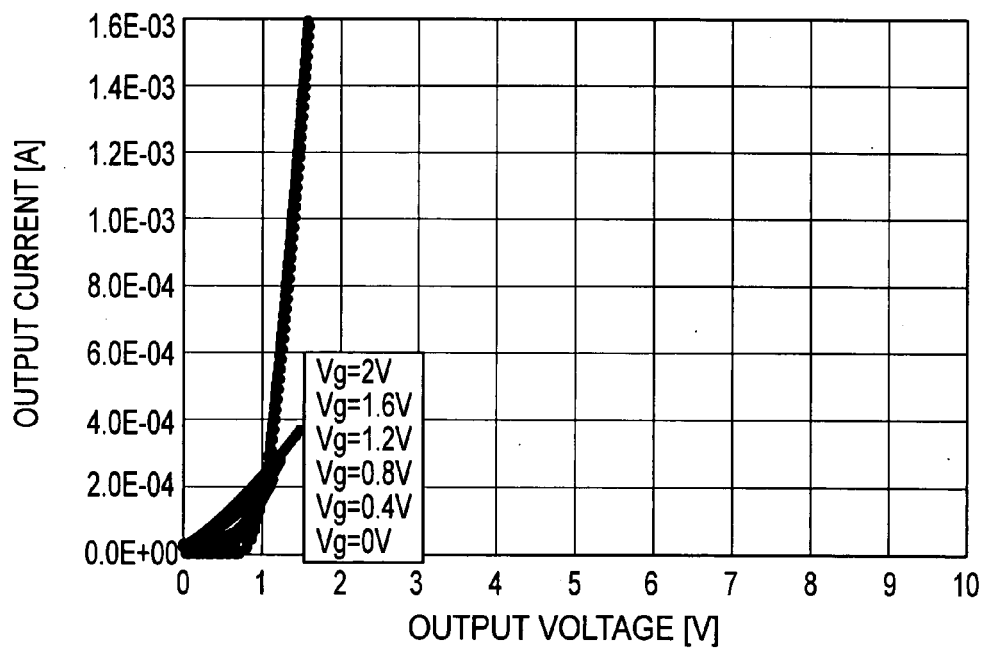
FIG. 8B shows the output characteristics when a source of the source tie type transistor of FIG. 8A is used as an output terminal.

As for the body, the first, the second, the third, and the fourth regions of the transistor used in the same dimension and the impurity concentration and dimension w2 of the second region in a channel width direction is used without any change.

body: thickness=400 nm, conductivity type=p-type silicon, and impurity concentration=1E16 atoms/cm$^3$ gate: n-type polysilicon, gate length: L1=10 μm and L2=5 μm, gate oxide film thickness=30 nm, and thickness of an insulating layer 20: 400 nm impurity concentration of the first, the second, and the fourth regions: peak value to 1E20 atoms/cm$^3$ impurity concentration of the third region; peak value to 5E19 atoms/cm$^3$ length of the third region; 3 μm impurity concentration in portions of the first and the fourth regions where the impurity concentration is low: 2.5E17 atoms/cm$^3$, and length: 2 μm, and w2=25 μm FIGS. 8A and 8B show output characteristics of the conventional transistor of the source tie structure. FIG. 8A is a graph when the first region serves as a drain and the second region serves as a source, whereas FIG. 8B is a graph when the second region serves as the drain and the first region serves as the source. As indicated in the output characteristics of FIG. 8B, when the output voltage exceeds about 1V, the output current does not exhibit saturation current characteristics as in the conventional MOS transistor, but increases as the output voltage increases. From the characteristics obtained by the actual measurement, it is confirmed that in the transistor of the source tied structure, if the second region is used as the drain, it hardly withstands voltage.

Figure 9:
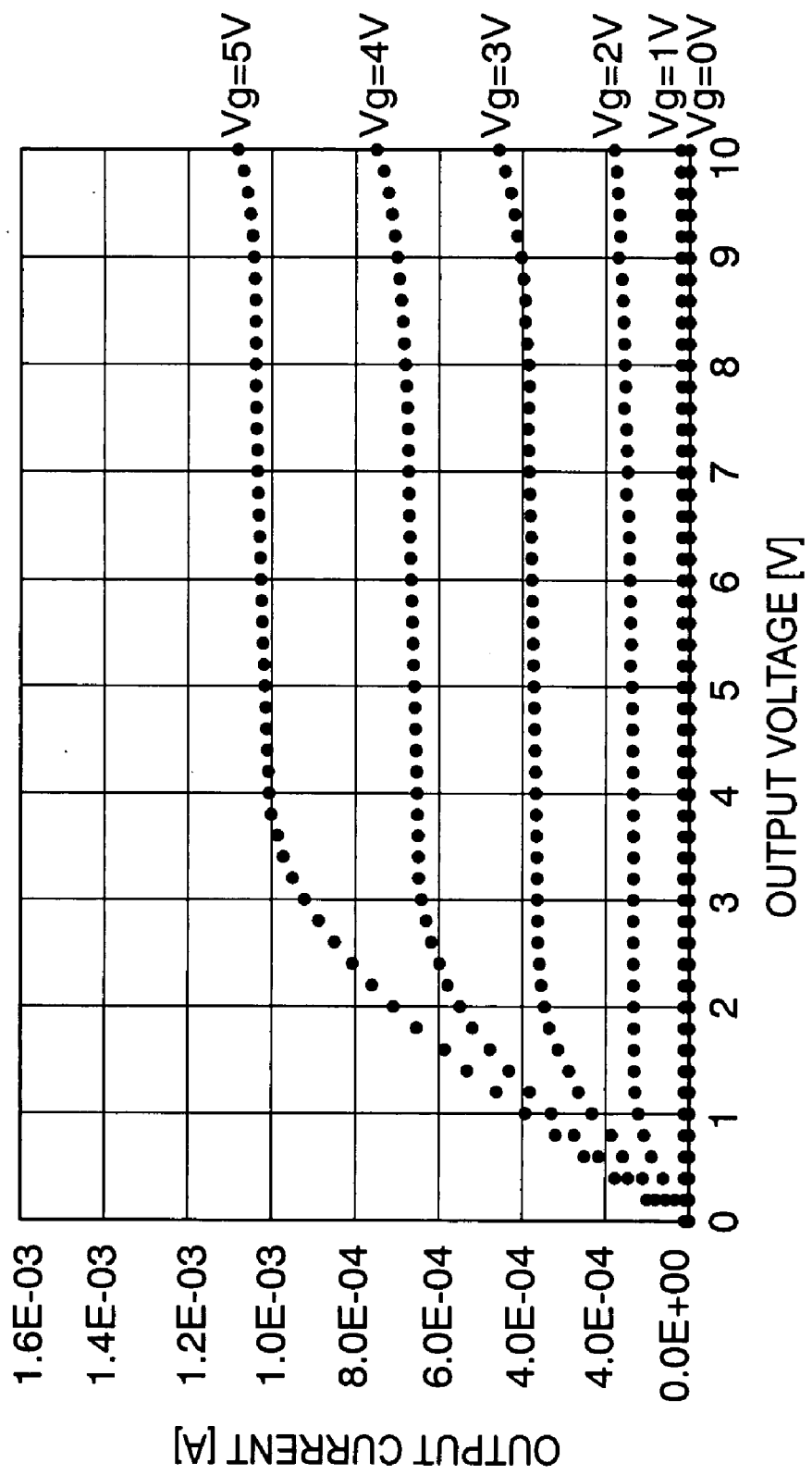
FIG. 9 shows output characteristics of the bi-directional transistor of the present invention.

On the other hand, FIG. 9 shows output characteristics of the transistor of the structure shown in FIG. 5 according to the present invention. The output characteristics are obtained when the first region serves as the drain and the fourth region serves as the source. However, even if the connection is performed such that they are interchanged with each other, the output characteristics hardly change. As compared with the output characteristics shown in FIG. 8A, in a portion where the gate voltage is high, the output current is decreased substantially corresponding to the increased channel length (L1/(L1+L2)). In a voltage range where the gate voltage approximates a gate threshold voltage, the decrease in the output current is improved.

Figure 10:
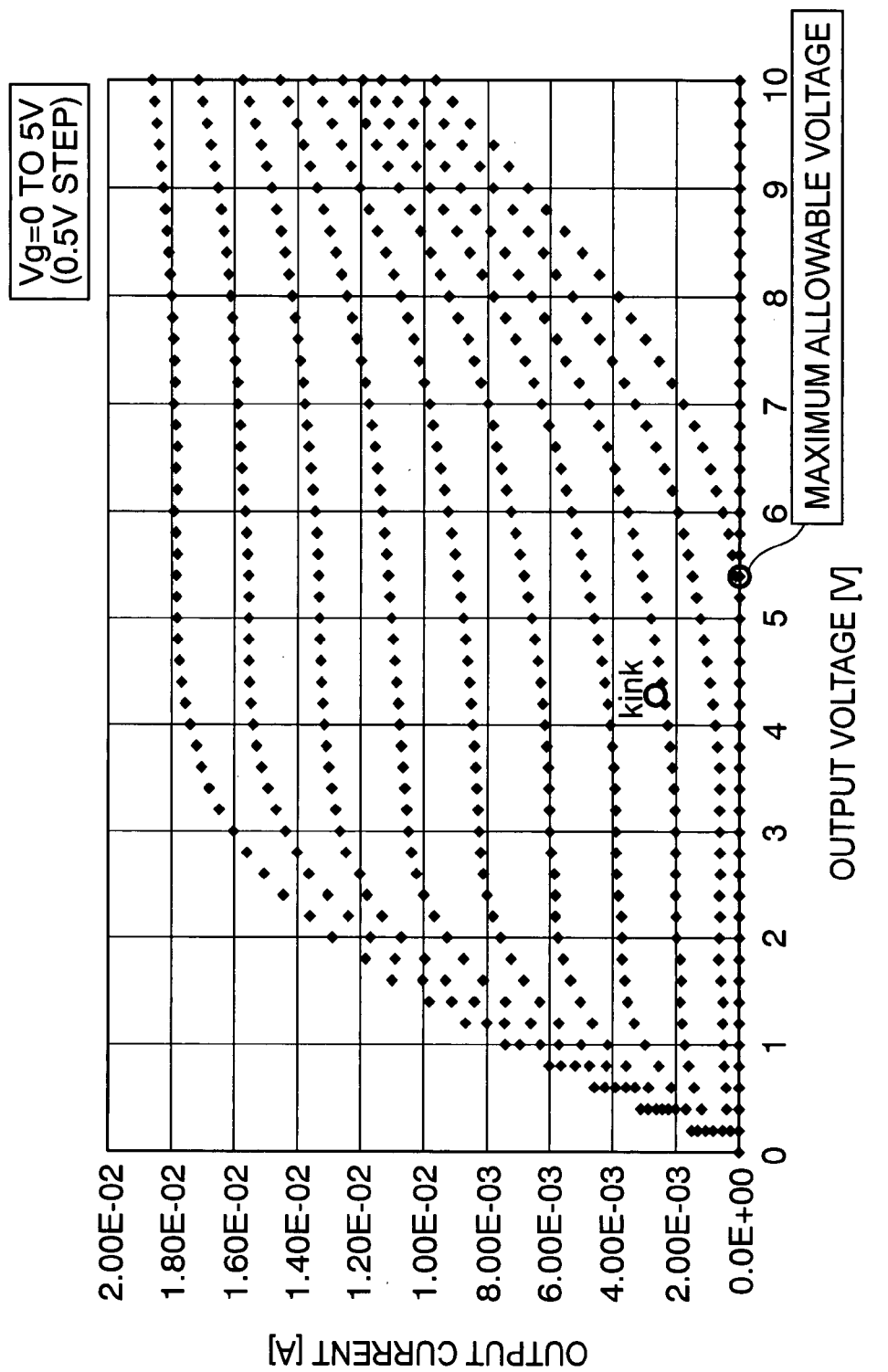
FIG. 10 shows output characteristics of a transistor in which a distance between third regions is 100 μm.
Figure 11:
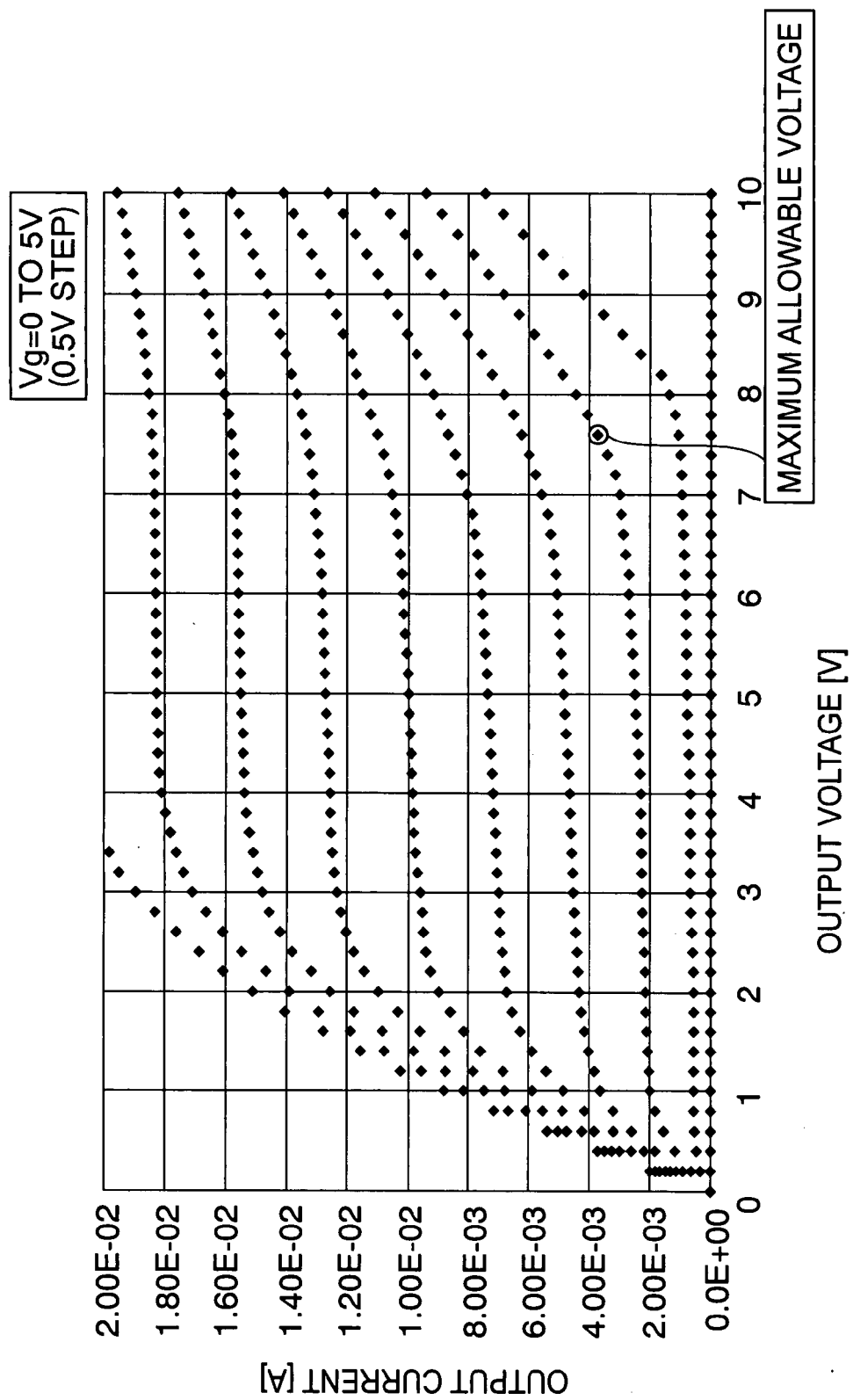
FIG. 11 shows the output characteristics of the transistor in which the distance between the third regions is 10 μm.

Of the structures and the material parameters of the transistor, the gate length is set to 2 μm, the channel width in total is set to 100 μm, and only the value of w2 is changed. In this state, output current-output voltage characteristics of the transistor when w2 are examined. The characteristics when w2 is 100 μm are shown in FIG. 10 and the ones when w2 is 10 μm are shown in FIG. 11.

Figure 12:
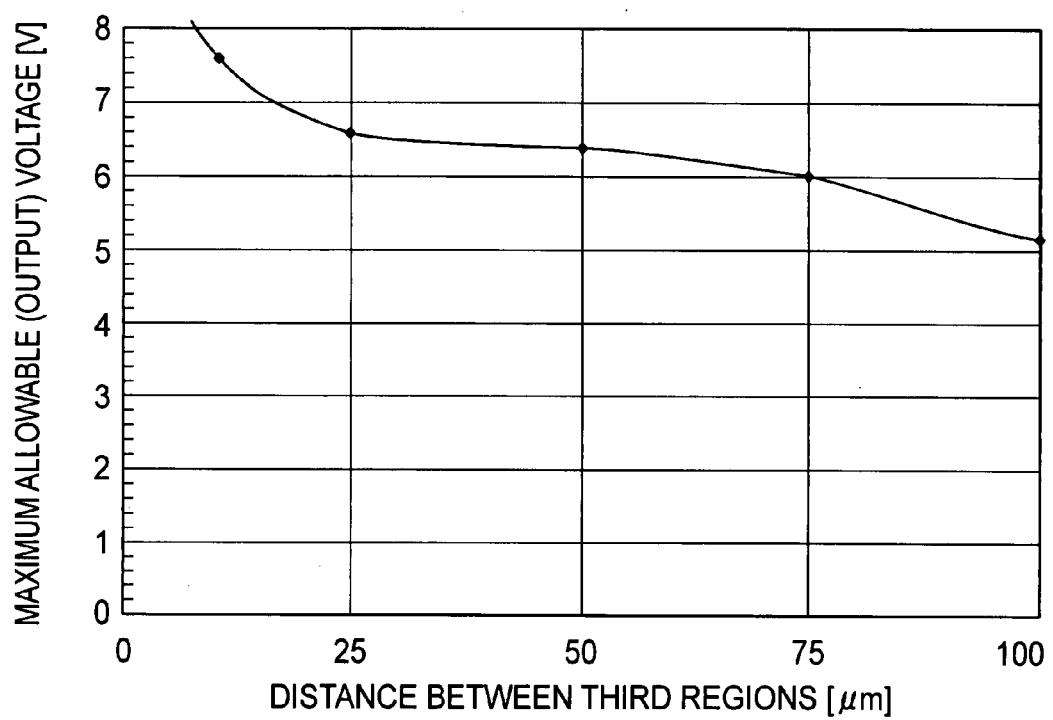
FIG. 12 is a graph showing an experimental example for illustrating a relation between a maximum allowable voltage and the distance between the third regions.

When the output voltage is increased while the gate voltage is fixed, a voltage at which an output conductance dIout/dVout is increased to equal to a channel conductance of the transistor is supposedly set as a maximum allowable voltage of the output voltage. This is shown by a graph of FIG. 12.

When w2 is 100 μm, the maximum allowable voltage is significantly decreased due to the kink effect as described above. The kink effect itself is observed at the output voltage of 4V+ΔV, so that when w2 is 100 μm, it can be observed that the maximum allowable voltage is improved to 5.4 V. Further, when w2 is 75 μm that is a value 50 times the channel length (about 1.5 μm), the kink effect is further relieved. Thus, in this state, the maximum allowable voltage is then affected largely by the following factors. This condition corresponds to the width of the second region which is equal to a value 25 times the channel length and expressed by 75/2=38 μm, when the third region is formed between the two second regions.

After the kink effect is relieved, a factor determining the maximum allowable voltage is then a degree to which minority carriers generated due to increase of the carriers in the drain-body junction are absorbed into the third region. As for the factor, it is confirmed that by setting the w2 to a value 10 times the channel length or less, the maximum allowable voltage can be significantly improved.

According to the structure of the present invention, the plural third regions are formed, whereby the generated minority carriers with the reverse polarity can be absorbed efficiently with a small distance w2 between the plural third regions. With this effect, it is possible to realize the increase in the maximum allowable voltage of the output voltage as in the above-mentioned embodiment.

For achieving the same effect as above in the conventional bidirectional transistor, the H-type structure is employed and the channel width is required to be about 10 times or less as large as the channel length in the above-mentioned example. This involves an overhead area of the H-type structure out to a negligible range in the end. In this case, the necessary current capacity is achieved by using repeatedly the unit structure for arrangement. As a result, the area is almost the same as in the intrinsic transistor and is rather disadvantageous by the complicated interconnections to the body contact region in each unit H structure.

As an effect of the present invention further advantageous in the circuit application, the transistor can be formed such that the operation at both of the positive and the negative potentials with respect to the conventional body potential is possible.

What is claimed is:

1. A field effect transistor comprising:

an insulating substrate;

a semiconductor thin film formed on the insulating substrate;

a gate insulating film formed on the semiconductor thin film;

a first gate electrode with a length and a width formed on the gate insulating film;

a first region and at least one second region having a first conductivity type and being formed on or in a surface of the semiconductor thin film on opposite sides of the first gate electrode in the length direction thereof;

at least one third region having a second conductivity type opposite the first conductivity type arranged side-by-side with the second region in the width direction of the first gate electrode;

a conductive thin film connected with the second region and the third region;

a second gate electrode with a length and a width formed on the gate insulating film along the second region; and a fourth region having the first conductivity type formed on or in the surface of the semiconductor thin film and on an opposite side of the second region with respect to the second gate electrode in a length direction thereof, one of the first and the fourth regions being independently used as an output region according to a bidirectional circuit operation of the field effect transistor and without application of a fixed bias potential to the third region.

2. A field effect transistor according to claim 1; wherein each of the at least one second region and the at least one third region comprises a plurality of second regions and a plurality of third regions, respectively, and one of the plurality of second regions is arranged so that it is sandwiched between the plurality of third regions in the width direction of the first gate electrode.

3. A field effect transistor according to claim 2; wherein a distance between the respective third regions is set to be no more than 50 times as large as a channel length of the field effect transistor.

4. A field effect transistor according to claim 2; wherein a distance between the third regions is set to be no more than 10 times as large as a channel length of the field effect transistor.

5. A field effect transistor according to claim 1; wherein the first and fourth regions each have a portion with a relatively low impurity concentration and a portion with a relatively high impurity concentration, the portion with a relatively low impurity concentration being arranged closer to the first or the second gate electrode than the portion with a relatively high impurity concentration.

6. A field effect transistor according to claim 1; wherein the insulating substrate is made of an insulating material selected from the group consisting of glass, sapphire, and ceramic.

7. A field effect transistor according to claim 1; wherein the insulating substrate comprises an insulating film formed on a silicon substrate.

8. A field effect transistor according to claim 1; wherein the third region is formed of a silicide metal thin film, which partially contacts the semiconductor thin film.

9. A field effect transistor comprising:

an insulating substrate;

a semiconductor thin film formed on the insulating substrate;

a gate insulating film formed on the semiconductor thin film;

a first gate electrode with a length and a width formed on the gate insulating film;

a first region and a second region having a first conductivity type formed on or in a surface of the semiconductor thin film and being arranged on opposite sides of the first gate electrode in the length direction thereof;

a third region having a second conductivity type opposite the first conductivity type;

a conductive thin film connected with the second region and the third region;

a second gate electrode with a length and a width formed on the gate insulating film along the second region; and a fourth region having the first conductivity type formed on or in the surface of the semiconductor thin film and on an opposite side of the second region with respect to the second gate electrode in a length direction thereof, one of the first and the fourth regions being independently used as an output region according to a bidirectional circuit operation of the field effect transistor and without application of a fixed bias potential to the third region.

10. A field effect transistor formed on an insulating substrate according to claim 9; wherein a width of the second region is set as no more than 25 times as large as a channel length of the field effect transistor.

* * * * *